(12) United States Patent
Chi et al.

(10) Patent No.: US 9,406,642 B1
(45) Date of Patent: Aug. 2, 2016

(54) INTEGRATED CIRCUIT PACKAGING SYSTEM WITH INSULATED TRACE AND METHOD OF MANUFACTURE THEREOF

(71) Applicants: HeeJo Chi, Yeoju-gun (KR); Bartholomew Liao Chung Foh, Singapore (SG); Sheila Marie L. Alvarez, Singapore (SG); Zigmund Ramirez Camacho, Singapore (SG); Dao Nguyen Phu Cuong, Singapore (SG)

(72) Inventors: HeeJo Chi, Yeoju-gun (KR); Bartholomew Liao Chung Foh, Singapore (SG); Sheila Marie L. Alvarez, Singapore (SG); Zigmund Ramirez Camacho, Singapore (SG); Dao Nguyen Phu Cuong, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/642,130

(22) Filed: Mar. 9, 2015

Related U.S. Application Data

(60) Provisional application No. 61/951,375, filed on Mar. 11, 2014.

(51) Int. Cl.
*H01L 23/00* (2006.01)
*H01L 21/48* (2006.01)
*H01L 23/12* (2006.01)

(52) U.S. Cl.
CPC ............. *H01L 24/81* (2013.01); *H01L 21/481* (2013.01); *H01L 23/12* (2013.01); *H01L 24/17* (2013.01); *H01L 2924/1533* (2013.01)

(58) Field of Classification Search
CPC ........ H01L 24/81; H01L 24/17; H01L 21/481; H01L 23/12
See application file for complete search history.

(56) References Cited

U.S. PATENT DOCUMENTS

| 6,861,740 | B2* | 3/2005 | Hsu | H01L 23/50 257/691 |
|---|---|---|---|---|
| 8,618,649 | B2* | 12/2013 | Rathburn | H01L 23/49811 257/688 |
| 8,884,431 | B2* | 11/2014 | Lin et al. | 257/738 |
| 8,884,443 | B2 | 11/2014 | Chen et al. | |
| 2015/0004756 | A1* | 1/2015 | Chi et al. | 438/127 |
| 2015/0228561 | A1* | 8/2015 | Lin | H01L 23/49541 257/676 |

* cited by examiner

*Primary Examiner* — William Coleman
(74) *Attorney, Agent, or Firm* — Wong & Rees LLP

(57) ABSTRACT

An integrated circuit packaging system and method of manufacture thereof includes: a substrate; a plain trace on the substrate; an insulated trace on the substrate; an insulation layer on the insulated trace, the insulation layer at least partially covers the insulated trace; and a semiconductor device over the substrate, the semiconductor device has a plain bump attached on the plain trace and an inner bump attached on the insulated trace, and the plain bump is mounted adjacent to the insulation layer.

17 Claims, 6 Drawing Sheets

INTEGRATED CIRCUIT PACKAGING SYSTEM WITH INSULATED TRACE AND METHOD OF MANUFACTURE THEREOF

CROSS-REFERENCE TO RELATED APPLICATION

This application claims the benefit of U.S. Provisional Patent Application Ser. No. 61/951,375 filed Mar. 11, 2014, and the subject matter thereof is incorporated herein by reference thereto.

TECHNICAL FIELD

The present invention relates generally to an integrated circuit packaging system, and more particularly to a packaging system with an insulated trace.

BACKGROUND ART

Semiconductor chips have become progressively more complex, driven in large part by the need for increasing processing power in a smaller chip size for compact or portable electronic devices such as cell phones, smart phones, personal media systems, or ultraportable computers.

A redistribution layer (RDL) can allow the use of smaller chip sizes while still having access to all contact points. The RDL can be formed in a "fan-in" or "fan-out" configuration, depending on the application. However, creating the RDL at small scales with the required precision can be a time-consuming and expensive process.

The RDL having non-insulated traces, or "fan-in" "fan-out" traces, brings up a risk of bump bridges in fine bump pitch flip chip applications. The fine bump pitch flip chip applications have smaller spacing between the non-insulated traces, resulting in the risk of the bump bridges. The bump bridges can create unwanted electrical connection shorting the bumps and the adjacent traces, causing circuit failures or malfunctions.

Thus, a need still remains for a precise and cost-effective way of creating an RDL. In view of the shrinking sizes of electronic components, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The embodiments of the present invention provide a method of manufacture of an integrated circuit packaging system including: providing a substrate; forming a plain trace on the substrate; forming an insulated trace on the substrate; depositing an insulation layer on the insulated trace, the insulation layer at least partially covers the insulated trace; and mounting a semiconductor device over the substrate, the semiconductor device has a plain bump attached on the plain trace and an inner bump attached on the insulated trace, and the plain bump is mounted adjacent to the insulation layer.

The embodiments of the present invention provide an integrated circuit packaging system including: a substrate; a plain trace on the substrate; an insulated trace on the substrate; an insulation layer on the insulated trace, the insulation layer at least partially covers the insulated trace; and a semiconductor device over the substrate, the semiconductor device has a plain bump attached on the plain trace and an inner bump attached on the insulated trace, and the plain bump is mounted adjacent to the insulation layer.

Certain embodiments of the present invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
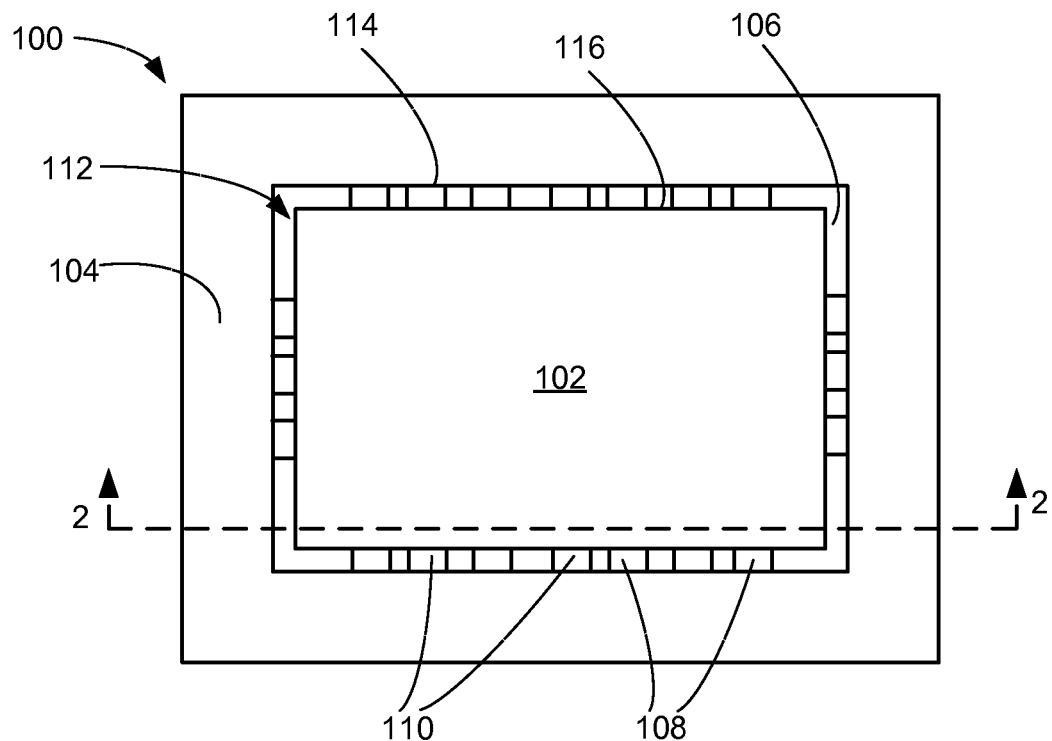
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of embodiments of the present invention.

In the following description, numerous specific details are given to provide a thorough understanding of the invention. However, it will be apparent that the invention may be practiced without these specific details. In order to avoid obscuring the embodiments of the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the embodiments of the present invention.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view shows a semiconductor device 102, a substrate covered by a protection layer 104, center area 106 exposed from the protection layer 104. The semiconductor device 102 is mounted over and centered with the center area 106. Plain traces 108 and insulated traces 110 are partially shown between the semiconductor device 102 and the protection layer 104. The plain traces 108 and the insulated traces 110 are conductive traces constructing the RDL of the integrated circuit packaging system 100. The plain traces 108 and the insulated traces 110 having bump pads on surfaces thereof for mounting the semiconductor device 102. The insulated traces 110 have an insulation layer at least partially covering the insulated traces 110, wherein the insulation layer is deposited in between the bumps pads of the plain traces 108.

In the integrated circuit packaging system 100, the semiconductor device 102 can be mounted over the substrate. The plain traces 108 and the insulated traces 110 can be configured to provide electrical routes connecting the semiconductor device 102 to the substrate via bumps, including plain bumps and inner bumps. The bumps can be attached to interconnectors to an active side of the semiconductor device 102, and are mounted on the plain traces 108 and the insulated traces 110 electrically connecting the substrate to the semiconductor device 102. The insulation layer is deposited on the insulated traces 110 at least partially covering exposed surfaces of the insulated traces 110. The insulation layer is hidden under the semiconductor device 102 and not shown in FIG. 1.

For example, in this embodiment of the present invention, the semiconductor device 102, such as a flip chip, is mounted over the substrate. The plain traces 108 and the insulated traces 110 can be exposed in the center area 106. The bumps can be attached on the active side of the semiconductor device 102, and be mounted on the bump pads of the plain traces 108 and the insulated traces 110. The insulation layer is deposited on the insulated traces 110 partially covering the insulated traces 110.

The plain traces 108 and the insulated traces 110 are formed with conductive materials, such as metals or metal alloys. The insulated traces 110 are the conductive traces with the insulation layer deposited thereon. The plain traces 108 are the conductive traces without the insulation layer. For example, in this embodiment of the present invention, the insulated traces 110 and the plain traces 108 can be formed with copper (Cu) or copper alloy. The bumps can be formed as copper pillar bumps in fine bump pitch flip chip application.

The protection layer 104, such as a solder resist layer, a solder mask, or a layer of dielectric ink, can be deposited on a periphery of a substrate top surface 112. An inner perimeter 114 of the protection layer 104 can outline the center area 106, and can be parallel with a chip perimeter 116. The center area 106 can be configured to various shapes and locations. The semiconductor device 102 can be centered with and smaller than the center area 106.

Figure 2:
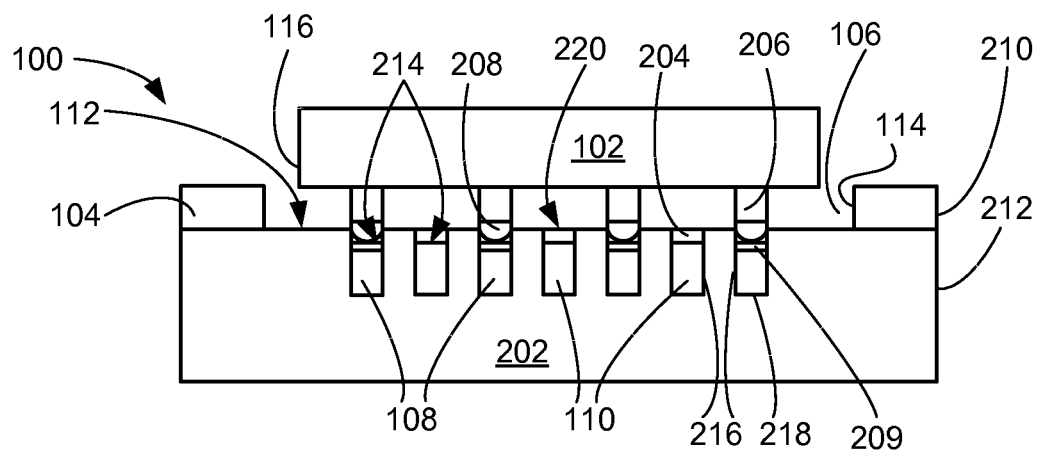
FIG. 2 is a cross-sectional view of the integrated circuit packaging system of FIG. 1 along the section line 2-2 of FIG. 1.

Referring now to FIG. 2, therein is shown a cross-sectional view of the integrated circuit packaging system 100 along the section line 2-2 of FIG. 1. This view shows the semiconductor device 102 mounted above a substrate 202. The protection layer 104 can be formed on the periphery of the substrate top surface 112. The plain traces 108 and the insulated traces 110 are embedded in the substrate 202. An active side of the semiconductor device 102 has interconnectors 206 where bumps 208 are attached thereto. An insulation layer 204 is formed on the insulated traces 110 in between the bumps 208. The bumps 208 can be attached to the bump pads 209 of the plain traces 108 and the insulated traces 110 electrically connecting the semiconductor device 102 to the substrate 202.

The protection layer 104 can partially cover the substrate 202. The plain traces 108 and the insulated traces 110 are exposed in the center area 106 for mounting the semiconductor device 102. An outer perimeter 210 of the protection layer 104 is coplanar with a substrate perimeter 212 of the substrate 202.

For example, in this embodiment of the present invention, the protection layer 104 can cover the periphery of the substrate top surface 112, and expose the center area 106 for mounting the semiconductor device 102. The outer perimeter 210, such as outer vertical surfaces of the protection layer 104, is coplanar with the substrate perimeter 212, such as vertical surfaces of the substrate 202. The inner perimeter 114, such as inner vertical surfaces of the protection layer 104, can be greater than the chip perimeter 116, such as vertical surfaces of the semiconductor device 102 but smaller than the outer perimeter 210. A protection layer top surface is parallel with the substrate top surface 112 with a uniform thickness.

The semiconductor device 102 can be electrically connected to the substrate 202 via the bumps 208. The bumps 208 are attached to the active side of the semiconductor device 102. When the semiconductor device 102 is mounted over the plain traces 108 and the insulated traces 110, the bumps 208 can electrically connect the substrate 202 to the semiconductor device 102.

For example, in this embodiment of the present invention, the semiconductor device 102 can be electrically connected to the substrate 202 via the bumps 208. The bumps 208 can be in direct contact with the bump pads 209 of the plain traces 108 and the insulated traces 110.

The plain traces 108 and the insulated traces 110 can be embedded in the substrate top surface 112 in the center area 106, exposing only trace top surfaces 214. Trace side surfaces 216 and trace bottom surfaces 218 of the plain traces 108 and the insulated traces 110 are in direct contact with the substrate 202. The trace top surfaces 214 can be above, coplanar or below the substrate top surface 112. Each of the plain traces 108 and the insulated traces 110 is surrounded and isolated by the substrate 202.

For example, in this embodiment of the present invention, the plain traces 108 and the insulated traces 110 are completely embedded in the substrate 202. The trace top surfaces 214 and the trace bottom surfaces 218 are below the substrate top surface 112. The trace side surfaces 216 and the trace bottom surfaces 218 are in direct contact with the substrate 202.

The bumps 208 can be mounted on the insulated traces 110 and the plain traces 108. Each of the bumps 208 can be in direct contact with one of the bump pads 209 of the plain traces 108 and the insulated traces 110. When the semiconductor device 102 is mounted over the substrate 202, the bumps 208 can be fitted on and in direct contact with the trace top surfaces 214 of the plain traces 108 and the insulated traces 110

The insulation layer 204 is deposited onto the trace top surfaces 214 of the insulated traces 110 in between the bump pads 209 under the bumps 208. The insulation layer 204 is in direct contact with the trace top surfaces 214 of the insulated traces 110. The trace top surfaces 214 under the bumps 208 can include the bump pads 209. Insulation top surfaces 220 of the insulation layer 204 can be coplanar with the substrate top surface 112. The insulation layer 204 insulates the insulated traces 110 in between the bumps 208, and blocks any electrical path formed between the bumps 208 and the insulated traces 110 adjacent thereto.

The trace top surfaces 214 can be coated with an organic corrosion protection coating, such as an organic solderability preservatives (OSP) coating. The insulation layer 204 can be deposited directly on the organic corrosion protection coating. For example, in this embodiment of the present invention, the plain traces 108 and the insulated traces 110 can be formed with conductive metal copper (Cu). To protect the Cu surface, a copper organic solderability preservatives (CuOSP) coating can be coated on the Cu surface. The insulation layer 204 can be deposited on a surface of the CuOSP coating. The insulation layer 204 can also be deposited on the Cu surface after removal of the CuOSP coating by pre-cleaning.

Due to unprotected surfaces of the plain traces 108 and the insulated traces 110 in the center area 106, a risk of bump bridges is brought up and low through-put of thermal compression bonding (TCB) process should be required to reduce the risk. The bump bridges are conductive paths connecting the bumps 208 to the conductive traces adjacent thereto. The bump bridges can form unwanted electrical connections shorting the conductive traces, resulting in circuit malfunction or failure. For example, in this embodiment of the present invention, the protection layer 104 can expose the plain traces 108 and the insulated traces 110 in the center area 106. The bump bridges can be formed connecting the bumps 208 to the insulated traces 110 adjacent thereto. The low through-put of TCB process is required to reduce the risk of the bump bridges, slowing down the manufacture process and impacting manufacture productivity. Additional spaces in between the conductive traces can be required to reduce the risk, preventing mounting the fine bump pitch device.

It has been discovered that insulated conductive traces, such as the insulated traces 110 with the insulation layer 204 deposited thereon, can eliminate the risk of bump bridges, resulting in prevention of circuit malfunction and improvement of reliability. The insulation layer 204 deposited on the insulated traces 110 adjacent to the bump pads 209 under the bumps 208 of the plain trace 108, can cut off electrical connections created by the bump bridges, to prevent unwanted circuit short.

It has been discovered that the integrated circuit packaging system 100 with the insulated conductive traces, such as the insulated traces 110, can reduce spacing requirement between the insulated conductive traces, and enable mounting fine bump pitch flip chips or decreasing dimensions of the integrated circuit packaging system 100. The insulated conductive traces can be insulated at appropriate locations to cut off the electrical paths shorting the bumps 208 and the insulated traces 110 adjacent thereto. The insulated conductive traces can have smaller spacing in between than un-insulated conductive traces without the risk of the bump bridges. The reduction of the spacing requirement can enable the integrated circuit packaging system 100 to provide high pinout for mounting fine bump pitch flip chips, or to shrink the dimension of the integrated circuit packaging system 100.

Figure 3:
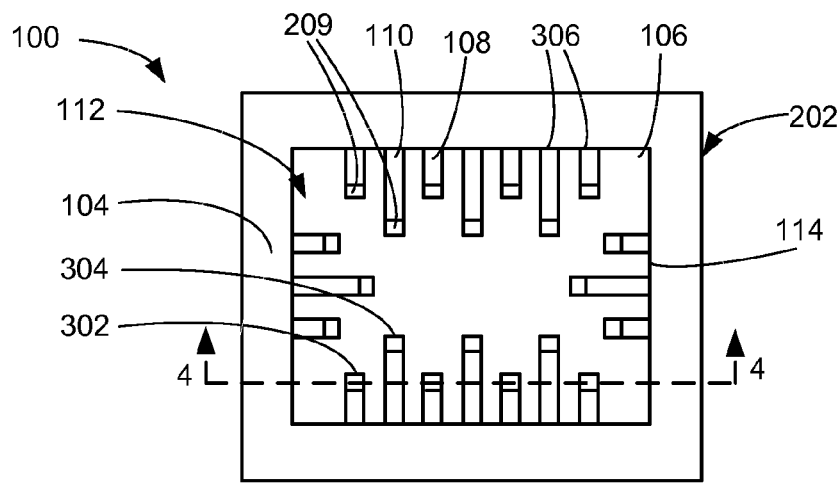
FIG. 3 is a top view of a substrate of the integrated circuit packaging system in the first embodiment of the present invention.

Referring now to FIG. 3, therein is shown a top view of the substrate 202 of the integrated circuit packaging system 100 in the first embodiment of the present invention. The substrate 202 is covered by the protection layer 104 with the center area 106 exposed. The plain traces 108 and the insulated traces 110 are formed in the center area 106. The plain traces 108 and the insulated traces 110 are conductive traces constructing the RDL of the integrated circuit packaging system 100. The plain traces 108 and the insulated traces 110 having bump pads 209 on surfaces thereof for mounting the semiconductor device 102 of FIG. 1.

The protection layer 104 can protect the substrate top surface 112 from being damaged during manufacturing processes. The plain traces 108 and the insulated traces 110 are exposed in the center area 106 for mounting the semiconductor device 102 of FIG. 1.

The plain traces 108 and the insulated traces 110 can be formed alternately along the edges of the center area 106. The plain traces 108 and the insulated traces 110 can be configured in different lengths. Inner plain ends 302 of the plain traces 108 are adjacent to the insulated traces 110. Inner ends 304 of the insulated traces 110 are extended beyond the inner plain ends 302 toward a center of the substrate 202. Opposite ends of the inner ends 304 or the inner plain ends 302 can be aligned along the inner perimeter 114 of the protection layer 104, extended under the protection layer 104, or exposed in the center area 106. The opposite ends of the inner ends 304 or the inner plain ends 302 can be coplanar or not. Each of the plain traces 108 is adjacent to one or more of the insulated traces 110. One or more of the insulated traces 110 can be in between two of the plain traces 108 that are adjacent to each other.

For example, in this embodiment of the present invention, outer trace ends 306 of the plain traces 108 can be coplanar and aligned along the inner perimeter 114. Each of the insulated traces 110 and the plain traces 108 is isolated from other of the insulated traces 110 and the plain traces 108 by the substrate 202. At least one of the insulated traces 110 is in between two of the plain traces 108 that are adjacent to each other. The length of the insulated traces 110 can be longer than the length of the plain traces 108. Each of the plain traces 108 is adjacent to one or two of the insulated traces 110. One of the insulated traces 110 can be in between two of the plain traces 108 that are adjacent to each other.

It has been discovered that forming the plain traces 108 and the insulated traces 110 in different lengths can reduce dimensions of the integrated circuit packaging system 100. Forming the plain traces 108 and the insulated traces 110 in different lengths can provide additional spaces for mounting the bumps 208 of FIG. 2 on the substrate 202, and can further reduce spacing requirement between the plain traces 108 and the insulated traces 110. The reduction of the spacing can enable fine bump pitch flip chip applications, or can shrink the dimensions of the integrated circuit packaging system 100.

Figure 4:
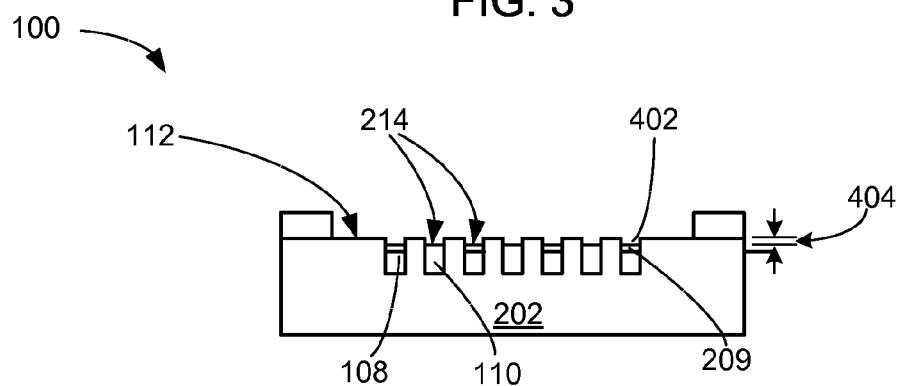
FIG. 4 is a cross-sectional view of the substrate of FIG. 3 along the section line 4-4 of FIG. 3.

Referring now to FIG. 4, therein is shown a cross-sectional view of the substrate 202 of FIG. 3 along the section line 4-4 of FIG. 3. The plain traces 108 and the insulated traces 110 can be formed in the substrate 202 alternately. The trace top surfaces 214 can be below the substrate top surface 112 to form trace top channels 402. A channel depth 404 is the depth of the trace top channels 402, which is the distance from the trace top surfaces 214 to the substrate top surface 112.

The plain traces 108 and the insulated traces 110 having bump pads 209 on surfaces thereof for mounting the semiconductor device 102 of FIG. 1. The plain traces 108 and the insulated traces 110 can be embedded and isolated in the substrate 202. The channel depth 404 can be adjusted in accordance with configurations of the manufactures. The trace top surfaces 214 can be exposed.

Figure 5:
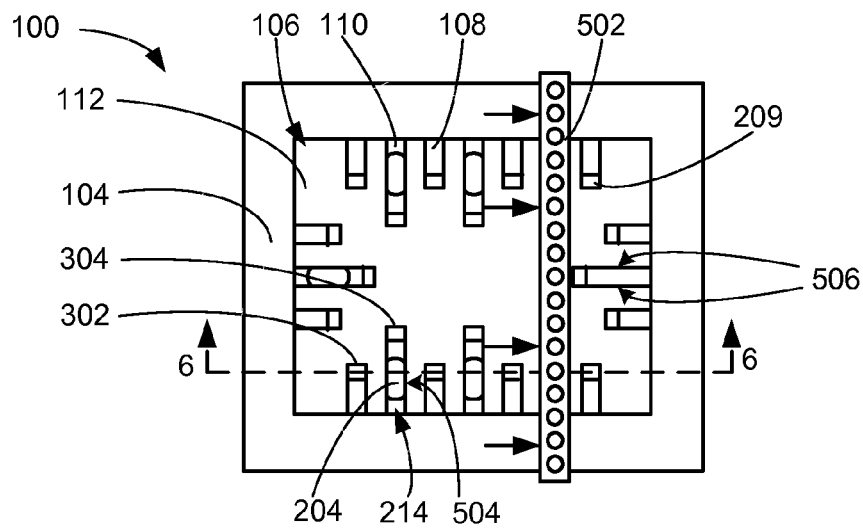
FIG. 5 is a top view of the structure of FIG. 3 in an insulation layer printing phase of manufacture.

Referring now to FIG. 5, therein is shown a top view of the structure of FIG. 3 in an insulation layer printing phase of manufacture. A printer head 502, such as an inkjet head or an aerosol jet head, moves over the substrate top surface 112. The insulation layer 204 is deposited on the trace top surfaces 214 of the insulated traces 110 at insulation locations 504. The insulation locations 504 are sections of the insulated traces 110 adjacent to the bumps 208 of FIG. 2 on the plain traces 108.

The insulation locations 504 can be configured in accordance with mounting locations of the bumps 208. For example, in this embodiment of the present invention, the bumps 208 can be mounted on the inner plain ends 302 and the inner ends 304. The insulation locations 504 can be configured adjacent to the bumps 208 at the inner plain ends 302. The insulation layer 204 can be deposited on at the insulation locations 504.

The insulation layer 204 can be deposited on the insulated traces 110, filling the sections of the trace top channels 402 of FIG. 4 at the insulation locations 504. The trace top surfaces 214 exposed at the insulation locations 504 can be fully covered by the insulation layer 204. For example, in this embodiment of the present invention, the insulation layer 204 can cover the trace top surfaces 214 at the insulation locations 504, from one of substrate contacting surfaces 506 to another one of the substrate contacting surfaces 506 crossing the insulated traces 110. The substrate contacting surfaces 506 are the vertical side walls of the trace top channels 402. None of the trace top surfaces 214 of the insulated traces 110 at the insulation locations 504 are exposed.

The insulation layer 204 can be deposited by various techniques. For example, in this embodiment of the present invention, the insulation layer 204 is deposited by direct patterning techniques with the dielectric ink. The dielectric inks can have predetermined viscosities, such as 100 centipoise (cps) or less, and a thickness of 5 um or less.

Figure 6:
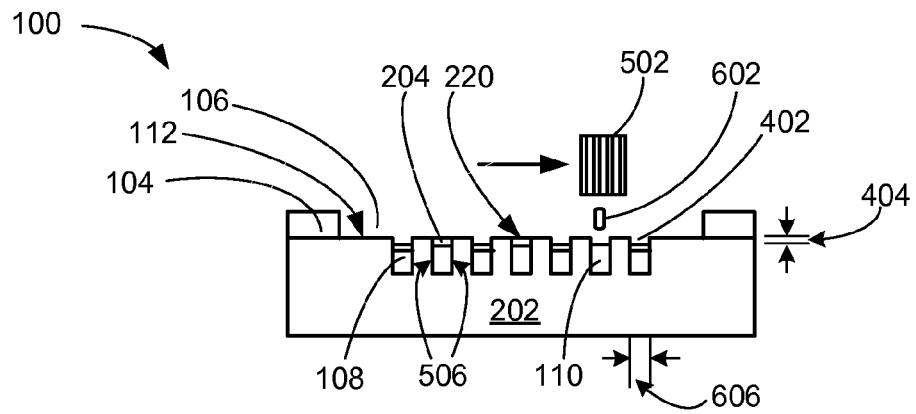
FIG. 6 is a cross-sectional view of the structure of FIG. 5 along the section line 6-6 of FIG. 5.

Referring now to FIG. 6, therein is shown a cross-sectional view of the structure of FIG. 5 along the section line 6-6 of FIG. 5. The printer head 502 moves over the substrate top surface 112, depositing dielectric ink 602 on the insulated traces 110 to form the insulation layer 204.

The locations of the insulation layer 204 are configured in accordance with the configurations of the integrated circuit packaging system 100. The insulation top surfaces 220 can be coplanar with or above the substrate top surface 112, extending from one of the substrate contacting surfaces 506 to another one of the substrate contacting surfaces 506 crossing the insulated traces 110. The amount of the dielectric ink 602 dropped in the trace top channels 402 of the insulated traces 110 can be pre-determined in accordance with the channel depth 404 and a channel width 606. The predetermined amount of the dielectric ink 602 is dropped to form the insulation layer 204 at desired locations. For example, in this embodiment of the present invention, the predetermined amount of the dielectric ink 602 can be deposited within the trace top channels 402, to form the insulation layer 204 within the trace top channels 402 but not on the substrate top surface 112. The insulation layer 204 covers the trace top surfaces 214 extending from one of the substrate contacting surfaces 506 to another one of the substrate contacting surfaces 506 crossing the insulated traces 110.

It has been discovered that utilizing direct patterning techniques to deposit the insulation layer 204 can reduce manufacture cycle and improve reliability. The insulation layer 204 can be formed in a single process to increase accuracy and reduce process time. The locations and thickness of the insulation layer 204 can be flexible and can be configured in accordance with the integrated circuit packaging system 100.

It has been discovered that the insulated traces 110 with the insulation layer 204 can improve package reliability and reduce package dimensions. The insulation layer 204 of the insulated traces 110 can block the electrical path resulting in prevention of the bump bridges between the adjacent conductive traces, such as the insulated traces 110 or the plain traces 108. Elimination of the bump bridges can prevent unwanted circuit short resulting in improvement of package reliability, and can reduce spacing requirement between the conductive traces resulting in reduction of the package dimensions or enabling the finer bump pitch flip chip applications.

Figure 7:
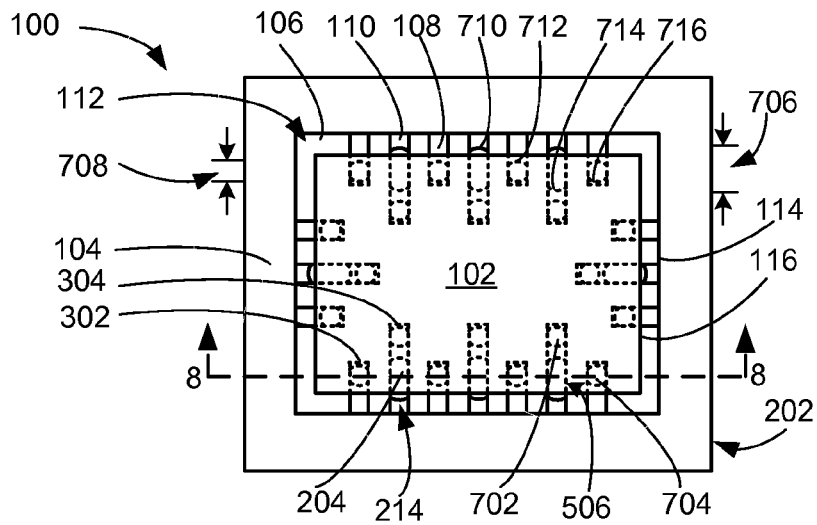
FIG. 7 is a plan view of the structure of FIG. 5 in a mounting phase of manufacture.

Referring now to FIG. 7, therein is shown a plan view of the structure of FIG. 5 in a mounting phase of manufacture. This view clearly shows the protection layer 104 covering the periphery of the substrate top surface 112, the center area 106 exposed from the protection layer 104, and the semiconductor device 102 mounted over the center area 106. The plain traces 108 and the insulated traces 110 are partially shown between the inner perimeter 114 of the protection layer 104 and the chip perimeter 116 of the semiconductor device 102. The semiconductor device 102 is centered with the center area 106.

The semiconductor device 102 is electrically connected to the substrate 202. Inner bumps 702 and plain bumps 704 are attached to the active side of the semiconductor device 102, electrically connecting the semiconductor device 102 to the substrate 202. The inner bumps 702 are mounted on mounting sections of the insulated traces 110, and the plain bumps 704 are mounted on mounting sections of the plain traces 108. The mounting sections can be configured in accordance with the integrated circuit packaging system 100. For example, in this embodiment of the present invention, the inner bumps 702 are mounted on the bump pads 209 of FIG. 5 of the insulated traces 110 at the inner ends 304, and the plain bumps 704 are mounted on the bump pads 209 of the plain traces 108 at the inner plain ends 302.

The length of the plain traces 108 can be configured differently than the length of the insulated traces 110. None of the inner bumps 702 are in between the plain bumps 704, and none of the plain bumps 704 are in between the inner bumps 702. For example, in this embodiment of the present invention, the plain bumps 704 are aligned with each other along the inner perimeter 114 of the protection layer 104. The inner bumps 702 are aligned with each other and extended inward beyond the plain bumps 704.

The insulation layer 204 can be deposited on and fully insulate the sections of the insulated traces 110 adjacent to the plain bumps 704. An insulation length 706 is the length of the insulation layer 204 along the substrate contacting surfaces 506. A bump length 708 is the length of the plain bumps 704 along the substrate contacting surfaces 506. The insulation length 706 can be same as or greater than the bump length 708. Edges of the insulation layer 204 can be aligned with or extended beyond edges of the plain bumps 704.

For example, in this embodiment of the present invention, the insulation length 706 is greater than the bump length 708. Insulation outer edges 710 of the insulation layer 204 are extended outward beyond bump outer edges 712 of the plain bumps 704. Insulation inner edges 714 are extended inward beyond bump inner edges 716. The trace top surfaces 214 of the insulated traces 110 in between the plain bumps 704 are fully covered and insulated by the insulation layer 204, from the insulation inner edges 714 to the insulation outer edges 710. No uninsulated surfaces of the plain traces 108 or the insulated traces 110 are exposed in between the plain bumps 704. The substrate 202 formed by insulating materials isolates each of the inner bumps 702 from other of the inner bumps 702. No uninsulated surfaces of the plain traces 108 or the insulated traces 110 are exposed in between the inner bumps 702.

It has been discovered that the insulated traces 110 with the insulation layer 204 can prevent circuit failures or malfunctions. The insulated traces 110 with the insulation layer 204 can eliminate the bump bridges formed in between the inner bumps 702 or the plain bumps 704. The elimination of the bump bridges can prevent unwanted circuit shorting of the integrated circuit packaging system 100.

Figure 8:
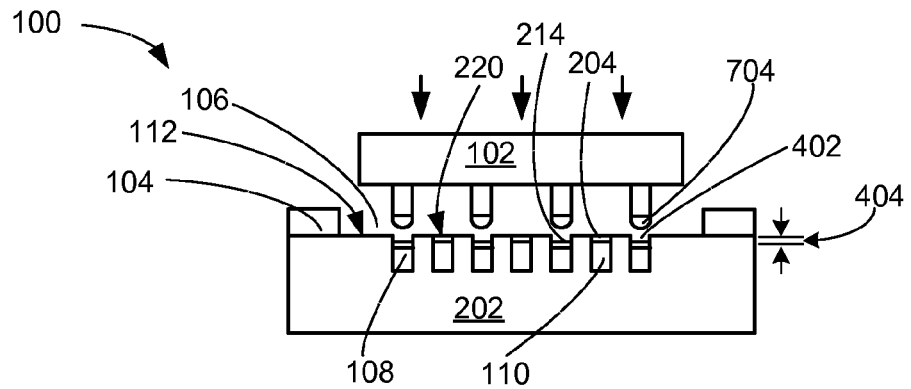
FIG. 8 is a cross-sectional view of the structure of FIG. 7 along the section line 8-8 of FIG. 7.

Referring now to FIG. 8, therein is shown a cross-sectional view of the structure of FIG. 7 along the section line 8-8 of FIG. 7. The semiconductor device 102 is pressed down over the substrate 202. The protection layer 104 is formed on the periphery of the substrate top surface 112 exposing the center area 106.

The semiconductor device 102 can have a plurality of the plain bumps 704 and the inner bumps 702 of FIG. 7. The plain bumps 704 and the inner bumps 702 can fit into the trace top channels 402, connecting the semiconductor device 102 to the substrate 202. The insulation layer 204 is deposited within the trace top channels 402 of the insulated traces 110, adjacent to the plain bumps 704.

The channel depth 404 of the trace top channels 402 can be configured in accordance with the integrated circuit packaging system 100. The insulation layer 204 can be deposited by various techniques, such as the direct page patterning techniques. The speed of the printer head 502 of FIG. 5 and the amount of the dielectric ink 602 of FIG. 6 dropped into the trace top channels 402 can be adjusted in accordance with the channel depth 404 to achieve a desired thicknesses and locations of the insulation layer 204. For example, in this embodiment of the present invention, the thickness of the insulation layer 204 is as same as the channel depth 404. The insulation top surfaces 220 are coplanar with the substrate top surface 112. The inner bumps 702 and the plain bumps 704 can be attached to the trace top surfaces 214 within the trace top channels 402.

It has been discovered that the trace top channels 402 can improve the reliability of the integrated circuit packaging system 100. The trace top channels 402 can secure the connections of the plain bumps 704 and the plain traces 108, and the inner bumps 702 and the insulated traces 110. The secured connections can prevent misalignments or disconnections, resulting in reliability improvement.

Figure 9:
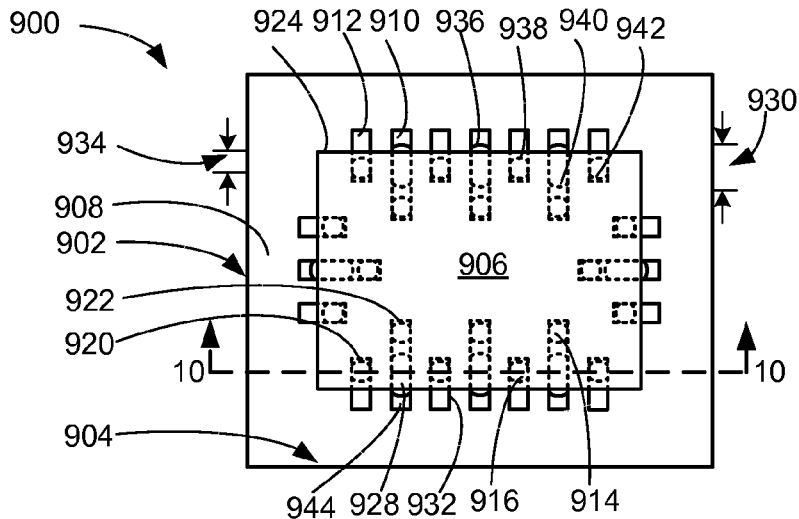
FIG. 9 is a plan view of an integrated circuit packaging system in a second embodiment of the present invention.

Referring now to FIG. 9, therein is shown a plan view of an integrated circuit packaging system 900 in a second embodiment of the present invention. This view clearly shows a substrate 902, a substrate top surface 904, and a semiconductor device 906. The semiconductor device 906 is mounted over a center of the substrate 902. A substrate periphery 908 of the substrate top surface 904 is exposed. The semiconductor device 906 is centered with the substrate top surface 904. Insulated traces 910 and plain traces 912 have bump pads and are exposed for mounting the semiconductor device 906.

The semiconductor device 906 can be connected to the substrate 902 via inner bumps 914 and plain bumps 916. The inner bumps 914 and the plain bumps 916 are attached to an active side of the semiconductor device 906 via interconnectors, electrically connecting the semiconductor device 906 to the substrate 902. The inner bumps 914 can be mounted on mounting sections of the insulated traces 910, and the plain bumps 916 can be mounted on mounting sections of the plain traces 912. The mounting sections can be configured in accordance with the integrated circuit packaging system 900. For example, in this embodiment of the present invention, the inner bumps 914 are mounted on inner ends 922, and the plain bumps 916 are mounted on inner plain ends 920. The bump pads can be under the inner bumps 914 and the plain bumps 916.

The length of the plain traces 912 can be configured differently than the length of the insulated traces 910. None of the inner bumps 914 are in between the plain bumps 916, and none of the plain bumps 916 are in between the inner bumps 914. For example, in this embodiment of the present invention, the plain bumps 916 are aligned with each other along chip perimeter 924 and attached to the bump pads of the plain traces 912. The inner bumps 914 are aligned with each other and are attached to the bump pads of the insulated traces 914 inward to the center of the substrate 902 beyond the plain bumps 916.

An insulation layer 928 can be deposited on and fully insulate the sections of the insulated traces 910 adjacent to the plain bumps 916. An insulation length 930 is the length of the insulation layer 928 along substrate contacting surfaces 932. A bump length 934 is the length of the plain bumps 916 along the substrate contacting surfaces 932. The insulation length 930 can be same as or greater than the bump length 934. Edges of the insulation layer 928 are aligned or extended beyond edges of the plain bumps 916.

For example, in this embodiment of the present invention, the insulation length 930 is greater than the bump length 934. Insulation outer edges 936 of the insulation layer 928 are extended outward beyond bump outer edges 938 of the plain bumps 916. Insulation inner edges 940 are extended inward beyond bump inner edges 942. Trace top surfaces 944 of the insulated traces 910 in between the plain bumps 916 are fully covered and insulated by the insulation layer 928, from the insulation inner edges 940 to the insulation outer edges 936. No uninsulated surfaces of the insulated traces 910 are exposed in between the plain bumps 916. The substrate 902 formed by insulating materials isolates each of the inner bumps 914 from other of the inner bumps 914. No uninsulated surfaces of the plain traces 912 or the insulated traces 910 are exposed in between the inner bumps 914.

It has been discovered that the insulated traces 910 with the insulation layer 928 can prevent circuit failures or malfunctions. The insulated traces 910 with the insulation layer 928 can eliminate the bump bridges formed in between the inner bumps 914 or the plain bumps 916. The elimination of the bump bridges can prevent unwanted circuit shorting of the integrated circuit packaging system 900.

Figure 10:
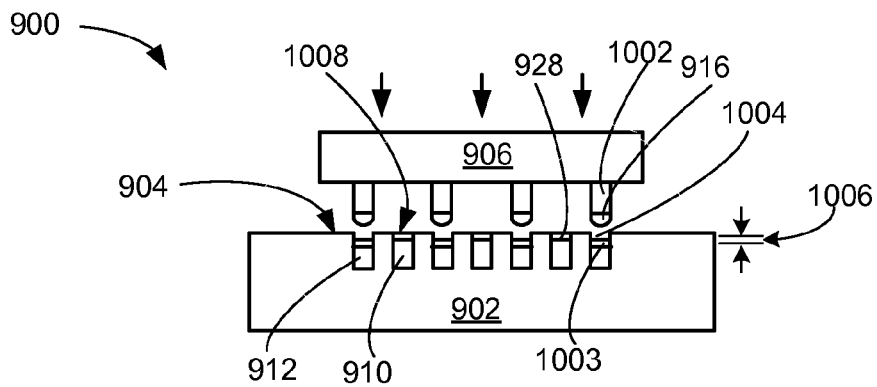
FIG. 10 is a cross-sectional view of the integrated circuit packaging system of FIG. 9 along the section line 10-10 of FIG. 9.

Referring now to FIG. 10, therein is shown a cross-sectional view of the integrated circuit packaging system 900 of FIG. 9 along the section line 10-10 of FIG. 9. The semiconductor device 906 is pressed down over the substrate 902. The substrate top surface 904 is fully exposed.

The semiconductor device 906 has plurality of the inner bumps 914 of FIG. 9 and the plain bumps 916. The plain bumps 916 and the inner bumps 914 are attached to interconnectors 1002 of the active side of the semiconductor device 906. The inner bumps 914 can be attached on the bump pads 1003 of the insulated traces 910, and the plain bumps 916 can be attached on the bump pads 1003 of the plain traces 912. The bump pads 1003 of the insulated traces 910 can be directly under and in contact with the inner bumps 914. The bump pads 1003 of the plain traces 912 can be directly under and in contact with the plain bumps 916. The plain bumps 916 can be fit into trace top channels 1004, connecting the semiconductor device 906 to the substrate 902. The insulation layer 928 is deposited within the trace top channels 1004 of the insulated traces 910 adjacent to the plain bumps 916.

A channel depth 1006 of the trace top channels 1004 can be configured in accordance with the integrated circuit packaging system 900. The insulation layer 928 can be deposited by various techniques, such as the direct patterning techniques. The speed of a printer head and the amount of dielectric ink dropped into the trace top channels 1004 can be determined in accordance with the channel depth 1006 for a desired thickness and locations of the insulation layer 928. For example, in this embodiment of the present invention, the thickness of the insulation layer 928 is same as the channel depth 1006. Insulation top surfaces 1008 can be coplanar with the substrate top surface 904. The insulation layer 928 is deposited within the trace top channels 1004 of the insulated traces 910 but not on the substrate top surface 904.

It has been discovered that the trace top channels 1004 can improve the reliability of the integrated circuit packaging system 900. The trace top channels 1004 can secure the connections of the plain bumps 916 and the plain traces 912, and the inner bumps 914 and the insulated traces 910. The secured connections can prevent misalignments or disconnections, resulting in reliability improvement.

Figure 11:
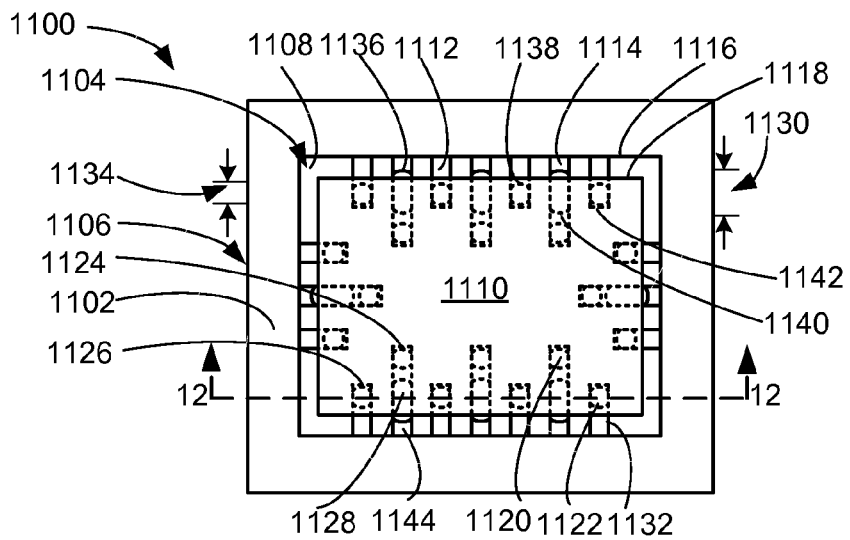
FIG. 11 a plan view of an integrated circuit packaging system in a third embodiment of the present invention.

Referring now to FIG. 11, therein is shown a plan view of an integrated circuit packaging system 1100 in a third embodiment of the present invention. This view clearly shows a protection layer 1102 covering a periphery of a substrate top surface 1104, a substrate 1106, center area 1108 exposed from the protection layer 1102, and a semiconductor device 1110 mounted over the center area 1108. Plain traces 1112 and insulated traces 1114 having bump pads are partially shown between an inner perimeter 1116 of the protection layer 1102 and a chip perimeter 1118 of the semiconductor device 1110. The semiconductor device 1110 is centered with the center area 1108.

For example, in this embodiment of the present invention, the protection layer 1102 can be a dielectric mask covering periphery of the substrate top surface 1104. The semiconductor device 1110 can be a flip chip.

Inner bumps 1120 and plain bumps 1122 having bump pads can be formed in the substrate 1106 exposed in the center area 1108. The inner bumps 1120 and the plain bumps 1122 are attached to an active side of the semiconductor device 1110, electrically connecting the semiconductor device 1110 to the substrate 1106. The inner bumps 1120 can be mounted on bump pads of mounting sections of the insulated traces 1114, and the plain bumps 1122 can be mounted on the bump pads of mounting sections of the plain traces 1112. The mounting sections can be configured in accordance with the integrated circuit packaging system 1100. For example, in this embodiment of the present invention, the inner bumps 1120 are mounted at inner ends 1124, and the plain bumps 1122 are mounted at inner plain ends 1126.

The length of the plain traces 1112 can be configured differently than the length of the insulated traces 1114. None of the inner bumps 1120 are in between the plain bumps 1122, and none of the plain bumps 1122 are in between the inner bumps 1120. For example, in this embodiment of the present invention, the plain bumps 1122 are aligned with each other along the inner perimeter 1116 of the protection layer 1102. The inner bumps 1120 are aligned with each other attached on the insulated traces 1114 inward beyond the plain bumps 1122.

An insulation layer 1128 can be deposited on and fully insulate the sections of the insulated traces 1114 adjacent to the plain bumps 1122. An insulation length 1130 is the length of the insulation layer 1128 along substrate contacting surfaces 1132. A bump length 1134 is the length of the plain bumps 1122 along the substrate contacting surfaces 1132. The insulation length 1130 can be same as or greater than the bump length 1134. Edges of the insulation layer 1128 are aligned or extended beyond edges of the plain bumps 1122.

For example, in this embodiment of the present invention, the insulation length 1130 is greater than the bump length 1134. Insulation outer edges 1136 of the insulation layer 1128 are extended outward beyond bump outer edges 1138 of the plain bumps 1122. Insulation inner edges 1140 are extended inward beyond bump inner edges 1142. Trace top surfaces 1144 of the insulated traces 1114 in between the plain bumps 1122 are fully covered and insulated by the insulation layer 1128, from the insulation inner edges 1140 to the insulation outer edges 1136. No uninsulated surfaces of the insulated traces 1114 are exposed in between the plain bumps 1122. The substrate 1106 formed by insulating materials isolates each of the inner bumps 1120 from other of the inner bumps 1120. No uninsulated surfaces of the plain traces 1112 and the insulated traces 1114 are exposed in between the inner bumps 1120.

It has been discovered that the insulated traces 1114 with the insulation layer 1128 can prevent circuit failures or malfunctions. The insulated traces 1114 with the insulation layer 1128 can eliminate the bump bridges formed in between the inner bumps 1120 or the plain bumps 1122. The elimination of the bump bridges can prevent unwanted circuit shorting of the integrated circuit packaging system 1100.

Figure 12:
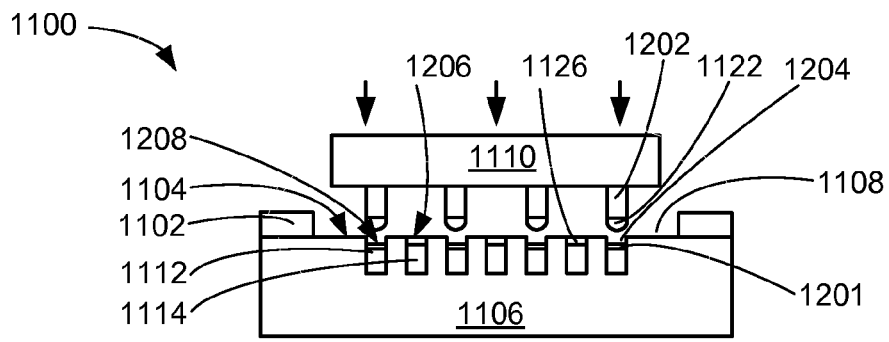
FIG. 12 is a cross-sectional view of the integrated circuit packaging system of FIG. 11 along the section line 12-12 of FIG. 11.

Referring now to FIG. 12, therein is shown cross-sectional view of the integrated circuit packaging system 1100 of FIG. 11 along the section line 12-12 of FIG. 11. The semiconductor device 1110 can be pressed down over the substrate 1106. The protection layer 1102 can be formed on the periphery of the substrate top surface 1104 exposing the center area 1108. The center area 1108 can be slightly larger than the semiconductor device 1110. The plain traces 1112 and the insulated traces 1114 have bump pads 1201 thereon.

The semiconductor device 1110 can have plurality of the inner bumps 1120 of FIG. 11 and the plain bumps 1122. The inner bumps 1120 and the plain bumps 1122 can be attached to interconnectors 1202 at the active side of the semiconductor device 1110. The plain bumps 1122 and the inner bumps 1120 can be fitted into trace top channels 1204, electrically connecting the semiconductor device 1110 to the substrate 1106. The insulation layer 1128 can be deposited within the trace top channels 1204 of the insulated traces 1114 adjacent to the plain bumps 1122.

A channel depth 1206 of the trace top channels 1204 can be configured in accordance with the integrated circuit packaging system 1100. The insulation layer 1128 can be deposited by various techniques, such as the direct patterning techniques. The direct patterning techniques can include inkjet printing and aerosol jet printing. The speed of a printer head and the amount of dielectric ink dropped into the trace top channels 1204 can be determined in accordance with the channel depth 1206. Insulation top surfaces 1208 can be coplanar with the substrate top surface 1104. The insulation layer 1128 is deposited within the trace top channels 1204 of the insulated traces 1114 only.

It has been discovered that the trace top channels 1204 can improve the reliability of the integrated circuit packaging system 1100. The trace top channels 1204 can secure the connections of the plain bumps 1122 and the plain traces 1112, and the inner bumps 1120 and the insulated traces 1114. The secured connections can prevent misalignments or disconnections, resulting in reliability improvement.

Figure 13:
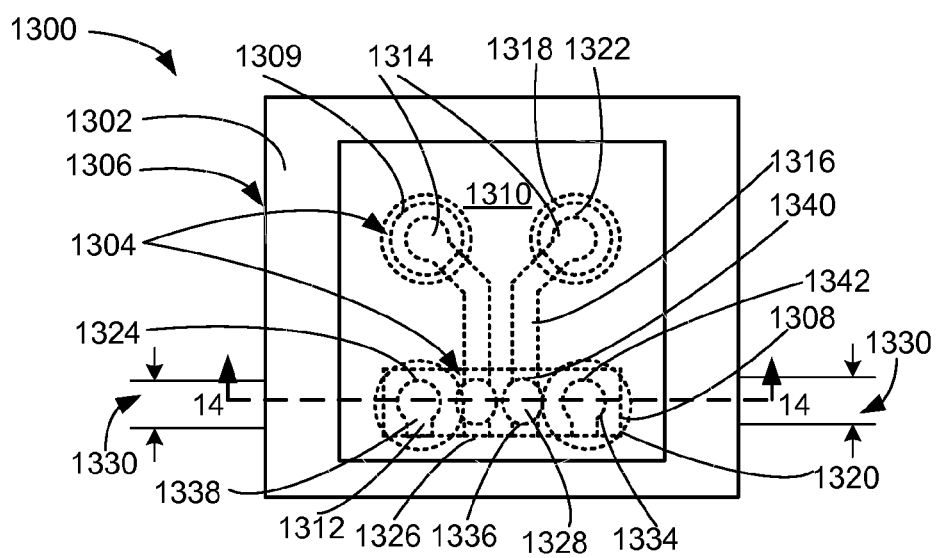
FIG. 13 is a plan view of an integrated circuit packaging system in a fourth embodiment of the present invention.

Referring now to FIG. 13, therein is shown a plan view of an integrated circuit packaging system 1300 in a fourth embodiment of the present invention. This view clearly shows a protection layer 1302 partially covering a substrate top surface 1304, a substrate 1306, a lower area 1308 and upper areas 1309 exposed from the protection layer 1302, and a semiconductor device 1310 mounted over the substrate 1306. Plain traces 1312 and insulated traces 1314 are formed on the substrate 1306, and can be at least partially exposed in the lower area 1308 or the upper areas 1309 under the semiconductor device 1310. Middle sections 1316 of the insulated traces 1314 can be embedded in the protection layer 1302.

For example, in this embodiment of the present invention, the protection layer 1302 can be a dielectric ink layer or a solder resist partially covering the substrate top surface 1304. The semiconductor device 1310 can be a flip chip.

The semiconductor device 1310 can be connected to the substrate 1306 via inner bumps 1318 and plain bumps 1320. The inner bumps 1318 and the plain bumps 1320 having bump pads are attached to an active side of the semiconductor device 1310, electrically connecting the semiconductor device 1310 to the substrate 1306. The inner bumps 1318 can be mounted on the bump pads of mounting sections of the insulated traces 1314, and the plain bumps 1320 can be mounted on the bump pads of mounting sections of the plain traces 1312. The mounting sections can be configured in accordance with the integrated circuit packaging system 1300. For example, in this embodiment of the present invention, the inner bumps 1318 are mounted at upper ends 1322 in the upper areas 1309, and the plain bumps 1320 are mounted at upper plain ends 1324 in the lower area 1308. The insulated traces 1314 are partially exposed in the upper areas 1309 and the lower area 1308. The plain traces 1312 are fully exposed in the lower area 1308.

The length of the plain traces 1312 can be configured differently than the length of the insulated traces 1314. None of the inner bumps 1318 are in between the plain bumps 1320, and none of the plain bumps 1320 are in between the inner bumps 1318. For example, in this embodiment of the present invention, the plain bumps 1320 are aligned with each other in the lower area 1308. The inner bumps 1318 are aligned with each other in the upper areas 1309.

The exposed portions of the insulated traces 1314 and the plain traces 1312 can be configured at multiple locations in accordance with the integrated circuit packaging system 1300. For example, in this embodiment of the present invention, the plain traces 1312 are formed and exposed in the lower area 1308. The insulated traces 1314 are formed and exposed in the lower area 1308 and the upper area 1309. The upper ends 1322 are exposed in the upper areas 1309. Lower ends 1326 are exposed in the lower area 1308. The middle sections 1316 can be embedded in the protection layer 1302. The inner bumps 1318 are attached to the bump pads of the insulated traces 1314, and the plain bumps 1320 are attached to the bump pads of the plain traces 1312. The bump pads can be directly under and in contact with the inner bumps 1318 and the plain bumps 1320.

An insulation layer 1328 can be deposited on and fully insulates the sections of the insulated traces 1314 adjacent to the plain bumps 1320 in the lower area 1308. An insulation length 1330 is the length of the insulation layer 1328. A bump contacting length 1332 is the length of contacting surfaces 1334 of the plain bumps 1320 and the plain traces 1312. The insulation length 1330 can be same as or greater than the bump contacting length 1332. Edges of the insulation layer 1328 can be re aligned or extended beyond edges of the plain bumps 1320.

For example, in this embodiment of the present invention, the insulation length 1330 is same as the bump contacting length 1332. Insulation outer edges 1336 of the insulation layer 1328 are aligned with bump contacting outer edges 1338 of the plain bumps 1320. Insulation inner edges 1340 are aligned with bump contacting inner edges 1342. The trace top surfaces of the insulated traces 1314 in between the plain bumps 1320 are fully covered and insulated by the insulation layer 1328, from the insulation inner edges 1340 to the insulation outer edges 1336. No uninsulated surfaces of the insulated traces 1314 are exposed in between the plain bumps 1320. The substrate 1306 formed by insulating materials isolates each of the inner bumps 1318 from other of the inner bumps 1318. No uninsulated surfaces of the plain traces 1312 or the insulated traces 1314 are exposed in between the inner bumps 1318.

The protection layer 1302 and the insulation layer 1328 can be formed by direct patterning techniques. For example, the protection layer 1302 and the insulation layer 1328 can be formed by inkjet printing and aerosol jet printing processes followed by dielectric ink curing process.

It has been discovered that the insulated traces 1314 with the insulation layer 1328 can prevent circuit failures or malfunctions. The insulated traces 1314 with the insulation layer 1328 can eliminate the bump bridges formed in between the inner bumps 1318 or the plain bumps 1320. The elimination of the bump bridges can prevent unwanted circuit shorting of the integrated circuit packaging system 1300.

Figure 14:
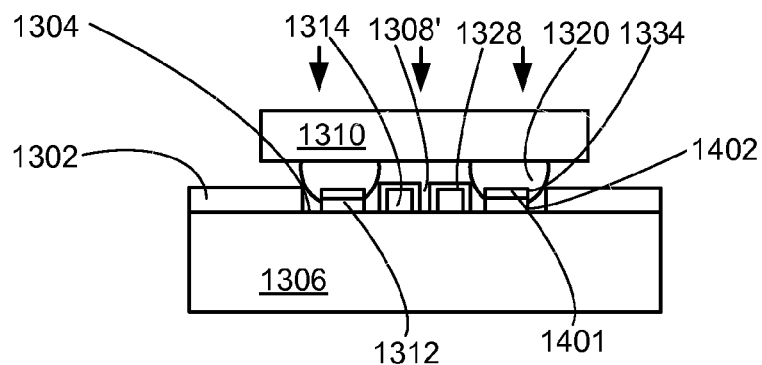
FIG. 14 is a cross-sectional view of the integrated circuit packaging system of FIG. 13 and along the section line 14-14 of FIG. 13.

Referring now to FIG. 14, therein is shown a cross-sectional view of the integrated circuit packaging system of FIG. 13 and along the section line 14-14 of FIG. 13. The semiconductor device 1310 can be pressed down over the substrate 1306. The protection layer 1302 can be formed on the substrate top surface 1304 exposing the lower area 1308 and the upper areas 1309 of FIG. 13. The plain traces 1312 and the insulated traces 1314 can have bump pads 1401 thereon.

The semiconductor device 1310 can have plurality of the inner bumps 1318 of FIG. 13 and the plain bumps 1320 attached to an active side of the semiconductor device 1310. The plain bumps 1320 can be mounted on the plain traces 1312 and the inner bumps 1318 can be mounted on the insulated traces 1314, electrically connecting the semiconductor device 1310 to the substrate 1306. The insulation layer 1328 can be deposited on the insulated traces 1314 adjacent to the plain bumps 1320.

The plain traces 1312 and the insulated traces 1314 can be formed on the substrate top surface 1304. Top surfaces and vertical surfaces of the plain traces 1312 and the insulated traces 1314 can be exposed above the substrate top surface 1304. The sections of the top surfaces and the vertical surfaces of the insulated traces 1314 adjacent to the plain bumps 1320 are fully covered and insulated with the insulation layer 1328. Any surfaces of the insulated traces 1314 in between the plain bumps 1320 are insulated by the insulation layer 1328. For example, in this embodiment of the present invention, the top surface and the vertical surfaces of the sections of the insulated traces 1314 adjacent to the plain bumps 1320 are fully covered and insulated with the insulation layer 1328.

The plain bumps 1320 can be attached on the top surfaces of the plain traces 1312, fully or partially extending on vertical surfaces 1402 of the plain traces 1312. The inner bumps 1318 can be attached on the top surfaces of the insulated traces 1314, fully or partially extending on vertical surfaces of the plain traces 1312. For example, in this embodiment of the present invention, the vertical surfaces 1402 of the plain traces 1312 are partially exposed from the plain bumps 1320. The insulation layer 1328 on the insulated traces 1314 fully covering the top surfaces and the vertical surfaces of the insulated traces 1314 adjacent to the plain bumps 1320. No un-insulated surfaces of the insulated traces 1314 adjacent to the plain bumps 1320 are exposed.

The insulation layer 1328 can be deposited on the insulated traces 1314 by various techniques, including direct patterning techniques with dielectric ink.

Figure 15:
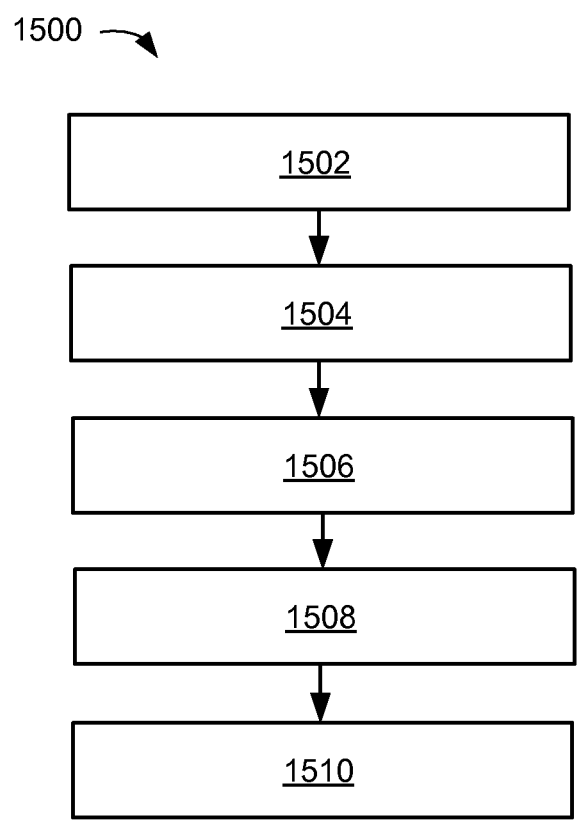
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes: providing a substrate in a block 1502; forming a plain trace on the substrate in a block 1504; forming an insulated trace on the substrate in a block 1506; depositing an insulation layer on the insulated trace, the insulation layer at least partially covers the insulated trace in a block 1508; and mounting a semiconductor device over the substrate, the semiconductor device has a plain bump attached on the plain trace and an inner bump attached to the insulated trace, and the plain bump is mounted adjacent to the insulation layer in a block 1510.

The insulation layer can be deposited on the insulated traces by various techniques. For example, in this embodiment of the present invention, the insulation layer can be deposited by direct patterning techniques with insulation material, such as dielectric ink. The direct patterning techniques are single step printing process without multiple steps of photo resist patterning, deposition, exposure, and removal. The direct patterning techniques can include inkjet printing or aerosol jet printing processes followed by dielectric ink curing process. The curing process refers to a toughening or hardening process of the dielectric ink. The insulated conductive traces can be formed in in-house processing in terms of fast, timely process, and quality control.

For example, inkjet printing technology can propel droplets of conductive inks or the dielectric inks with low viscosity, such as 100 cps or less, on subjects such as the conductive traces. The centipoise is one one-hundredth of a poise. The poise is the unit of dynamic viscosity in the centimeter-gram-second system of units. The dynamic viscosity of a fluid expresses its resistance to shearing flows, where adjacent layers move parallel to each other with different speeds.

For example, aerosol jet printing technology can use atomized liquid electronic materials, such as conductive inks or dielectric inks with 1 to 1,000 cps. The highly dense and highly loaded droplets of 2 um to 5 um diameter can be beamed out from the dense aerosol. Sheath gas can surround and focus a particle beam to less than 10 um diameter. The continuous beam flow can exit from the dense aerosol at 50 meter (m) per second and remains collimated for up to 5 millimeter (mm) This aerosol jet printing technology can print on planar or non-planar substrates. A tip of the dense aerosol can have a 2 mm to 5 mm standoff from the substrate.

In embodiments of the present invention, recommended droplets can be 30 um or less for deposition of the dielectric ink.

In order to use the direct patterning techniques, it is critical that the deposited ink has very low viscosity to be spread out well and evenly without exposure of metal surfaces. For example, in embodiments of the present invention, the dielectric ink can have a low viscosity as 100 cps or less. The level of the dielectric ink spread-out coverage can be well controlled by ink volume and/or plasma hydrophilic or hydrophobic treatment.

It is critical that the thickness of the insulation layer formed by the deposited ink is low to minimize interruption to under-fill flowing. The thickness of the insulation layer is preferred to be 5 um or less in terms of good underfill flow-ability. For example, to metal or metal alloy surfaces due to an intrinsic low surface energy thereof, the dielectric ink thickness can be 2 micron (um) or less.

It has been discovered that depositing an insulation layer with direct patterning techniques can reduce manufacturing cycle and improve reliability. Using the direct patterning techniques can simplify manufacturing process to reduce manufacturing cycle. Simplified manufacturing process can reduce misalignment resulting in reliability improvement.

It has been discovered that the insulated conductive traces can enable the integrated circuit packaging system 100 to utilize a mass reflow process to increase productivity without the risk of the bump bridges. The insulation layer on the insulated traces can provide protection for the insulated traces to prevent the bump bridges. By eliminating the risk of bump bridges, the integrated circuit packaging system 100 can utilize the mass reflow process to increase productivity and reduce manufacturing cycle.

It has been discovered that the integrated circuit packaging system with insulated conductive traces can improve assembly yield, and reduce scrap cost by elimination of bump bridge risk. The integrated circuit packaging system with insulated conductive traces also improve process throughput, reduces package cost by using mass reflow instead of TCB in fine bump pitch flip-chip application. The dielectric coating and the trace insulation layer can be deposited in the same process to simplify the manufacture procedure and improve productivity.

It has been discovered that this invention results in cost savings by converting from Thermal-Compression Bonding with Non-conductive Paste (TCNCP) to mass reflow for flip-chip bump joining process. The embodiments of the present invention can reduce the risk of bump bridges, and enable to use high through-put of mass reflow process by using insulated traces in between bumps. The insulation layer on the insulated traces is deposited by direct patterning with dielectric ink to achieve high productivity. In conclusion, the embodiments of the present invention result in very low packaging cost increase (~0.5% up), but expect much higher cost savings by converting from TCNCP to MR (~20% down).

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the embodiments of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   forming a plain trace on the substrate;
   forming an insulated trace on the substrate;
   depositing an insulation layer on a portion of a trace top surface of the insulated trace,
   the insulation layer spaced away from the plain trace; and
   mounting a semiconductor device over the substrate, the semiconductor device has a plain bump attached on the plain trace and an inner bump attached directly on the trace top surface of the insulated trace, and the plain bump is mounted adjacent to the insulation layer, and sections of the insulated trace adjacent to the plain bump are fully insulated by the insulation layer.

2. The method as claimed in claim 1 further comprising:
   disposing a protection layer on the substrate, and the protection layer at least partially exposes the plain trace and the insulated trace.

3. The method as claimed in claim 1 wherein:
   forming the plain trace includes forming the plain trace on a substrate top surface, a trace top surface and vertical surfaces of the plain trace are exposed above the substrate top surface; and
   forming the insulated trace includes forming the insulated trace on the substrate top surface, the trace top surface and vertical surfaces of the insulated trace are exposed above the substrate top surface.

4. The method as claims in claim 1 wherein:
   forming the plain trace includes forming the plain trace under a substrate top surface,
   a trace top surface and vertical surfaces of the plain trace are embedded under the substrate top surface; and
   forming the insulated trace includes forming the insulated trace under the substrate top surface, the trace top surface and vertical surfaces of the insulated trace are embedded under the substrate top surface.

5. The method as claimed in claim 1 wherein:
   depositing the insulation layer includes depositing the insulation layer using direct patterning techniques.

6. A method of manufacture of an integrated circuit packaging system comprising:
   providing a substrate;
   forming a plain trace on the substrate, the plain trace has a bump pad thereon; forming an insulated trace on the substrate, the insulated trace has the bump pad thereon;
   depositing an insulation layer on a portion of a trace top surface of the insulated trace, the insulation layer spaced away from the plain trace and the insulation layer adjacent to the bump pad of the plain trace; and mounting a semiconductor device over the substrate, the semiconductor device has a plain bump attached on the plain trace and an inner bump attached directly on the trace top surface of the insulated trace, the plain bump is mounted adjacent to the insulation layer, and sections of the insulated trace adjacent to the plain bump are fully insulation by the insulation layer.

7. The method as claimed in claim 6 further comprising: forming a protection layer on the substrate, the protection layer has a lower area and
   upper areas at least partially exposing the plain trace and the insulated trace.

8. The method as claimed in claim 6 wherein: forming the plain trace includes forming the plain trace on a substrate top surface, a
   trace top surface and vertical surfaces of the plain trace are exposed above the substrate top surface, the plain trace is adjacent to the insulated trace; and forming the insulated trace includes forming the insulated trace on the substrate top surface, the trace top surface and vertical surfaces of the insulated trace are exposed above the substrate top surface, the insulated trace has a length different than the plain trace;
   forming the insulated trace includes forming an insulated trace on the substrate top surface, the trace top surface and vertical surfaces of the insulated trace are exposed above the substrate top surface.

9. The method as claimed in claim 6 wherein: forming the plain trace includes forming the plain trace under a substrate top surface,
   a trace top surface and vertical surfaces of the plain trace are embedded under the substrate top surface, the plain trace is adjacent to the insulated trace; and forming the insulated trace includes forming the insulated trace under the substrate top surface, the trace top surface and vertical surfaces of the insulated trace are embedded under the substrate top surface, the insulated trace has a length different than the plain trace.

10. The method as claimed in claim 6 wherein:
    depositing the insulation layer includes depositing the insulation layer using direct patterning techniques with dielectric ink followed by a dielectric ink curing process.

11. An integrated circuit packaging system comprising:
    a substrate;
    a plain trace on the substrate, the plain trace has a bump pad on the plain trace;
    an insulated trace on the substrate, the insulated trace has the bump pad on the insulated trace;

a protection layer on the substrate, the protection layer has a lower area and upper areas at least partially exposing the plain trace and the insulated trace;

an insulation layer on a portion of a trace top surface of the insulated trace, the insulation layer spaced away from the plain trace; and a semiconductor device over the substrate, the semiconductor device has a plain bump attached on the bump pad of the plain trace and an inner bump attached directly on the trace top surface of the insulated trace, and the plain bump is mounted adjacent to the insulation layer.

12. The system as claimed in claim 11 wherein:

the plain trace includes the plain trace on a substrate top surface, a trace top surface and vertical surfaces of the plain trace are exposed above the substrate top surface; and the insulated trace includes the insulated trace on the substrate top surface, the trace top surface and vertical surfaces of the insulated trace are exposed above the substrate top surface.

13. The system as claimed in claim 11 wherein:

the plain trace includes the plain trace under a substrate top surface, a trace top surface and vertical surfaces of the plain trace are embedded under the substrate top surface; and the insulated trace includes the insulated trace under the substrate top surface, the trace top surface and vertical surfaces of the insulated trace are embedded under the substrate top surface.

14. The system as claimed in claim 11 wherein:

the plain bump and the inner bump are attached on interconnectors of an active side of the semiconductor device.

15. The system as claimed in claim 11 wherein:

the plain trace includes the plain trace on a substrate top surface, a trace top surface and vertical surfaces of the plain trace are exposed above the substrate top surface, the plain trace is adjacent to the insulated trace, the plain bump is attached to the top surface and the vertical surfaces of the plain trace; and the insulated trace includes the insulated trace on the substrate top surface, the trace top surface and vertical surfaces of the insulated trace are exposed above the substrate top surface, the insulated trace has a length different than the plain trace, the inner bump is attached to the top surface and the vertical surfaces of the insulated trace.

16. The system as claimed in claim 11 wherein:

the plain trace includes the plain trace under a substrate top surface, a trace top surface and vertical surfaces of the plain trace are embedded under the substrate top surface, the plain trace is adjacent to the insulated trace, the plain bump is attached to the top surface of the plain trace; and the insulated trace includes the insulated trace under the substrate top surface, the trace top surface and vertical surfaces of the insulated trace are embedded under the substrate top surface, the insulated trace has a length different than the plain trace, the inner bump is attached to the top surface of the insulated trace.

17. The system as claimed in claim 11 wherein:

the plain bump and the inner bump are attached on interconnectors of an active side of the semiconductor device, and electrically connect the semiconductor device to the substrate.

* * * * *